(12) United States Patent
Yagisawa

(10) Patent No.: US 10,382,142 B2
(45) Date of Patent: Aug. 13, 2019

(54) OPTICAL MODULE

(71) Applicant: FUJITSU COMPONENT LIMITED, Tokyo (JP)

(72) Inventor: Takatoshi Yagisawa, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/722,297

(22) Filed: Oct. 2, 2017

(65) Prior Publication Data

US 2018/0131448 A1    May 10, 2018

(30) Foreign Application Priority Data

Nov. 9, 2016 (JP) .................................. 2016-218968

(51) Int. Cl.
| | | |
|---|---|---|
| G02B 6/42 | (2006.01) | |
| H04J 14/02 | (2006.01) | |
| H04B 10/50 | (2013.01) | |
| H04B 10/40 | (2013.01) | |
| H04B 10/69 | (2013.01) | |
| H04B 10/80 | (2013.01) | |

(52) U.S. Cl.
CPC ....... *H04B 10/801* (2013.01); *H04B 10/6911* (2013.01); *H04B 10/6931* (2013.01); *G02B 6/42* (2013.01); *H01L 2924/3011* (2013.01); *H04B 10/40* (2013.01); *H04B 10/50* (2013.01); *H04J 14/02* (2013.01)

(58) Field of Classification Search
CPC .......... H01L 2924/3011; H04B 10/801; H04B 10/6911; H04B 10/6931; H04B 10/40; G02B 6/4201

USPC .......................................................... 398/200
See application file for complete search history.

(56) References Cited

U.S. PATENT DOCUMENTS

| | | | | |
|---|---|---|---|---|
| 5,960,141 A | * | 9/1999 | Sasaki .................... | G02B 6/421 385/88 |
| 6,164,838 A | * | 12/2000 | Maehara .............. | G02B 6/4246 361/749 |
| 6,894,266 B2 | * | 5/2005 | Richard ........... | H03K 19/00369 250/214 LA |
| 8,585,432 B2 | * | 11/2013 | Yagisawa ............. | H04B 10/801 439/493 |
| 8,749,523 B2 | * | 6/2014 | Pance .................... | G06F 1/1616 345/175 |
| 8,774,568 B2 | * | 7/2014 | Han ...................... | G02B 6/4206 385/14 |
| 8,891,975 B2 | * | 11/2014 | Yagisawa ........... | H04B 10/6911 398/200 |
| 9,325,418 B2 | * | 4/2016 | Kuroda ................ | G02B 6/4201 |

(Continued)

FOREIGN PATENT DOCUMENTS

| | | |
|---|---|---|
| JP | 2009-232380 | 10/2009 |
| JP | 2012-142822 | 7/2012 |

*Primary Examiner* — Abbas H Alagheband
(74) *Attorney, Agent, or Firm* — IPUSA, PLLC

(57) ABSTRACT

An optical module includes a board including a first surface and a second surface, a light-receiving element mounted on the first surface of the board, a capacitor mounted on the first surface of the board and connected to the light-receiving element, an optical waveguide attached to the second surface of the board and configured to transmit light, and a housing that covers the board. A recess is formed in an area of the inner surface of the housing to face the capacitor.

5 Claims, 6 Drawing Sheets

(56) References Cited

U.S. PATENT DOCUMENTS

| | | | |
|---|---|---|---|
| 9,794,017 B2* | 10/2017 | O'Daniel | G02B 6/4219 |
| 2004/0136660 A1* | 7/2004 | Cheng | G02B 6/4203 |
| | | | 385/88 |
| 2004/0159776 A1* | 8/2004 | Richard | H03K 19/00369 |
| | | | 250/214 R |
| 2009/0245807 A1* | 10/2009 | Nomura | H04B 10/6931 |
| | | | 398/135 |
| 2011/0043227 A1* | 2/2011 | Pance | G06F 1/1616 |
| | | | 324/681 |
| 2012/0063787 A1* | 3/2012 | Yagisawa | H04B 10/801 |
| | | | 398/164 |
| 2014/0284463 A1* | 9/2014 | Kuroda | G02B 6/4201 |
| | | | 250/216 |
| 2016/0028489 A1* | 1/2016 | Saeki | H04B 10/506 |
| | | | 398/79 |
| 2016/0149643 A1* | 5/2016 | Kasai | G02B 6/00 |
| | | | 398/79 |
| 2017/0048015 A1* | 2/2017 | O'Daniel | G02B 6/4219 |

* cited by examiner

OPTICAL MODULE

CROSS-REFERENCE TO RELATED APPLICATION

The present application is based upon and claims the benefit of priority of Japanese Patent Application No. 2016-218968, filed on Nov. 9, 2016, the entire contents of which are incorporated herein by reference.

BACKGROUND OF THE INVENTION

1. Field of the Invention

An aspect of this disclosure relates to an optical module.

2. Description of the Related Art

Electric cables made of, for example, copper have been used for communications performed by high performance computing systems and high-end servers via high-speed interfaces. However, optical cables are becoming popular to achieve high-speed signal transmission and to increase the transmission distance.

Next generation interfaces with a long transmission distance of tens of meters employ optical communication technologies, and use optical modules to connect optical cables to, for example, servers and convert electric signals into optical signals. An optical module converts an optical signal from an optical cable into an electric signal, outputs the electric signal to a server, converts an electric signal from the server into an optical signal, and outputs the optical signal to the optical cable.

An optical module includes, in a housing, a light-emitting element for converting an electric signal into an optical signal, a light-receiving element for converting an optical signal into an electric signal, a driving integrated circuit (IC) for driving the light-emitting element, and a trans-impedance amplifier (TIA) for converting an electric current into a voltage. The light-emitting element, the light-receiving element, the driving IC, and the TIA are mounted on a board. The light-emitting element and the light-receiving element are connected to a ferrule such as a lens ferrule via an optical waveguide.

In such an optical module, a photodiode (PD) is used as the light-receiving element; and a terminal of a capacitor is connected to the cathode of the PD and another terminal of the capacitor is grounded to stabilize a detection signal of the PD (see, for example, Japanese Laid-Open Patent Publication No. 2009-232380 and Japanese Patent No. 5625918).

An optical module as described above has two ground potentials: a frame ground of a housing and a signal ground of a board in the housing. For example, an optical module is inserted into a front panel of a server. When static electricity flows into a frame forming the front panel of the server or into a housing of the optical module, the optical module is grounded via the housing of the optical module which functions as the frame ground or via the frame of the server. Therefore, the signal ground of the board in the housing is not affected by the static electricity, and the optical module is not damaged.

In the housing of the optical module, a PD and a capacitor connected to the PD are mounted on the board. Depending on the location of the capacitor, static electricity may flow from the housing of the optical module, via the capacitor, into the signal ground, and the optical module may be damaged.

For the above reason, there is a demand for a highly-reliable optical module where static electricity does not flow into the signal ground even when a capacitor connected to a light-receiving element is provided in the housing of the optical module.

SUMMARY OF THE INVENTION

In an aspect of this disclosure, there is provided an optical module that includes a board including a first surface and a second surface, a light-receiving element mounted on the first surface of the board, a capacitor mounted on the first surface of the board and connected to the light-receiving element, an optical waveguide attached to the second surface of the board and configured to transmit light, and a housing that covers the board. A recess is formed in an area of the inner surface of the housing to face the capacitor.

DESCRIPTION OF EMBODIMENTS

Embodiments of the present invention are described below. The same reference number is assigned to the same component, and repeated descriptions of the same component are omitted.

First Embodiment

<Optical Module>

Figure 1:
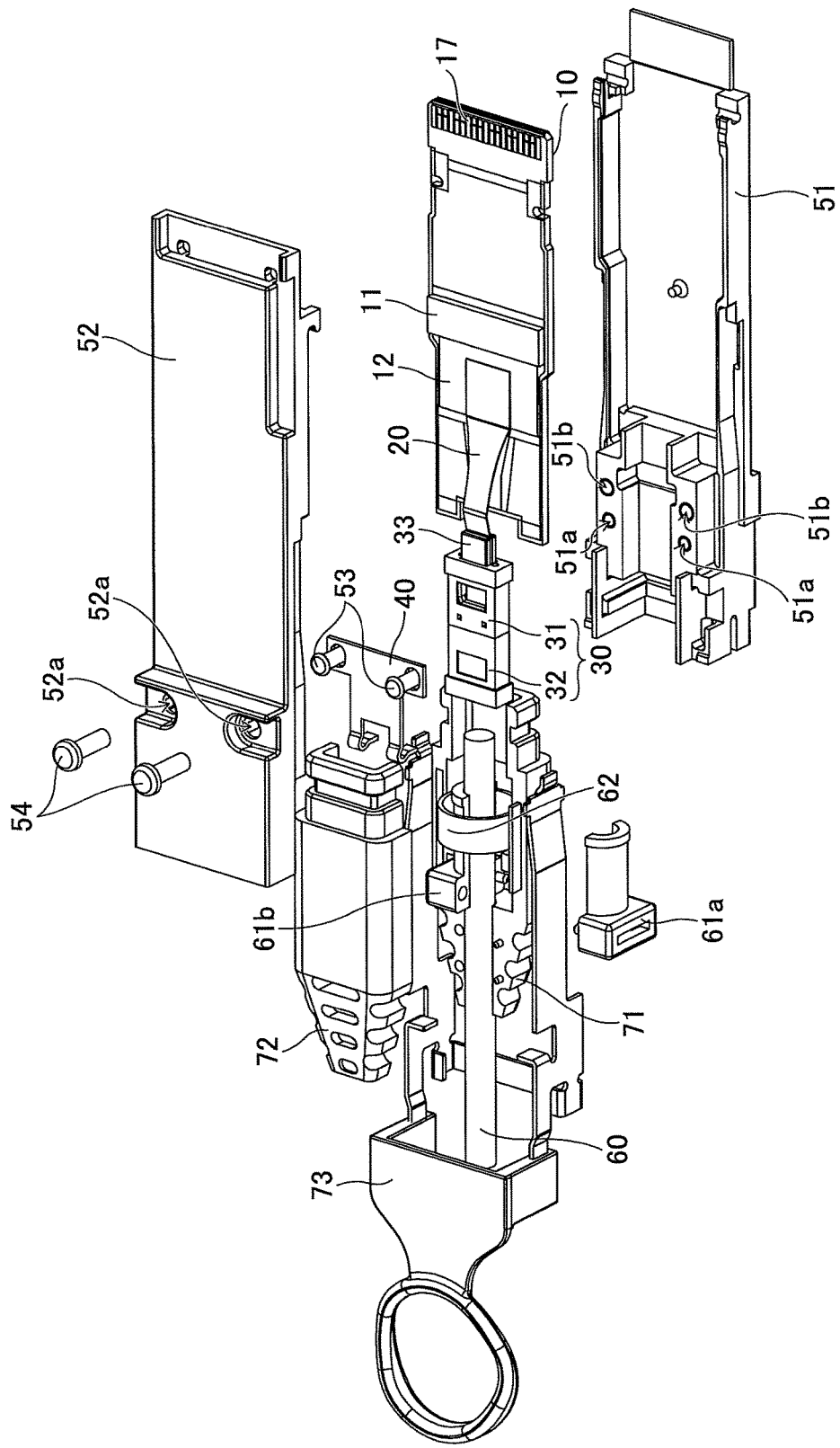
FIG. 1 is an exploded perspective view of an optical module of a first embodiment.
Figure 3:
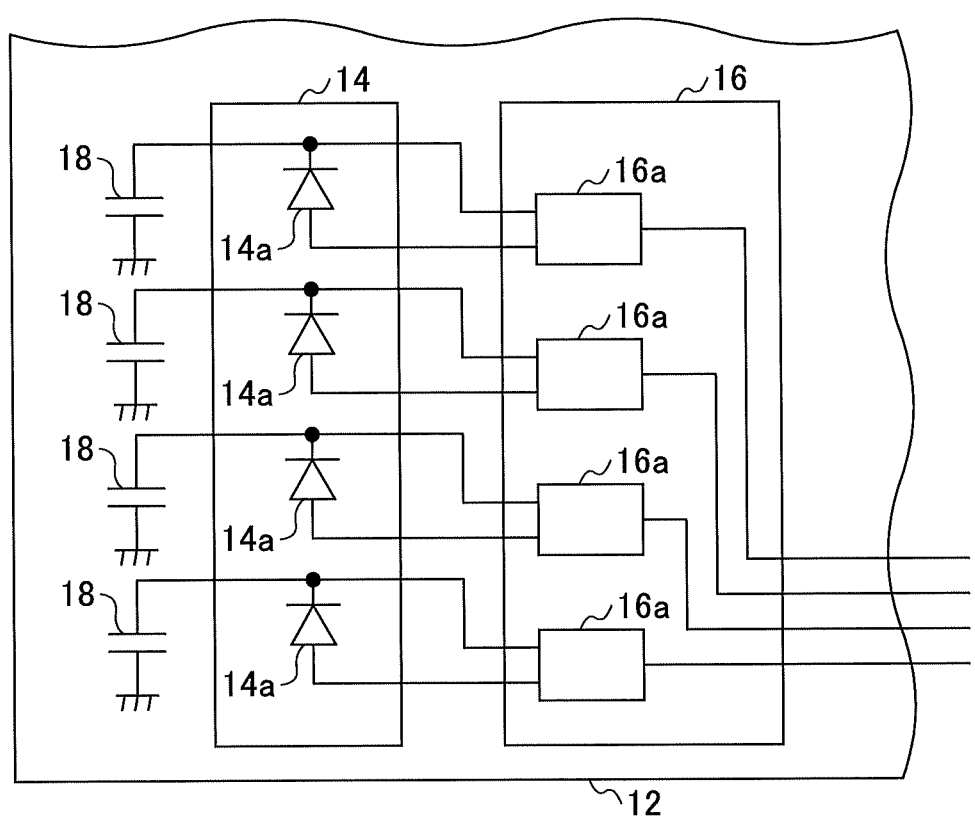
FIG. 3 is a circuit diagram of a part of the optical module of the first embodiment.
Figure 4:
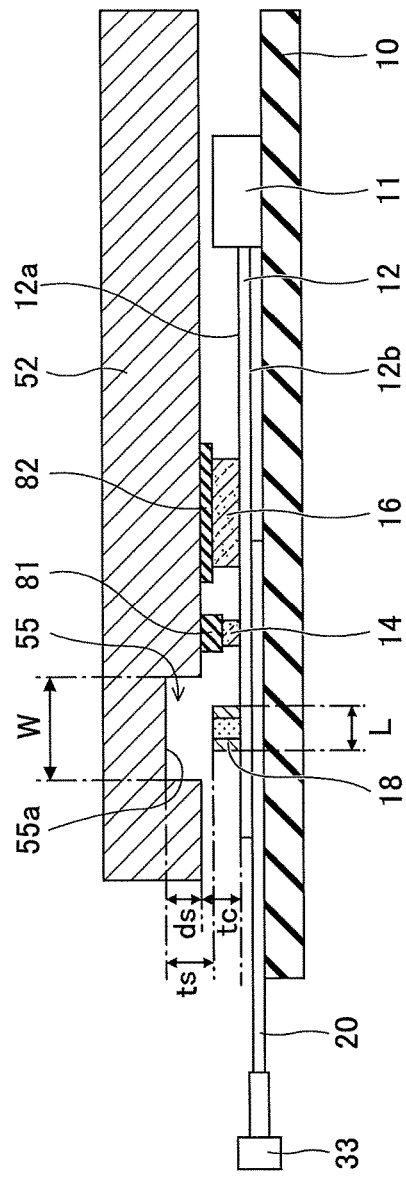
FIG. 4 is a cross-sectional view of a part of the optical module of the first embodiment.

An optical module according to a first embodiment is described with reference to FIGS. 1 through 4. FIG. 1 is an exploded perspective view of the optical module of the first embodiment, FIG. 2 is a top view of a part of the optical module, FIG. 3 is a circuit diagram of a part of the optical module, and FIG. 4 is a cross-sectional view of a part of the optical module.

As illustrated in FIG. 1, the optical module includes a connector board 10, an optical waveguide 20, an optical connector 30, and a clip 40 that are housed in a housing formed by a lower housing 51 and an upper housing 52. An optical cable 60 is connected to the optical module. A part of the optical cable 60 is covered by the housing.

The connector board 10 includes a flexible printed-circuit (FPC) connector 11 to which an FPC board 12 is connected, and a terminal 17 for external connection.

Figure 2:
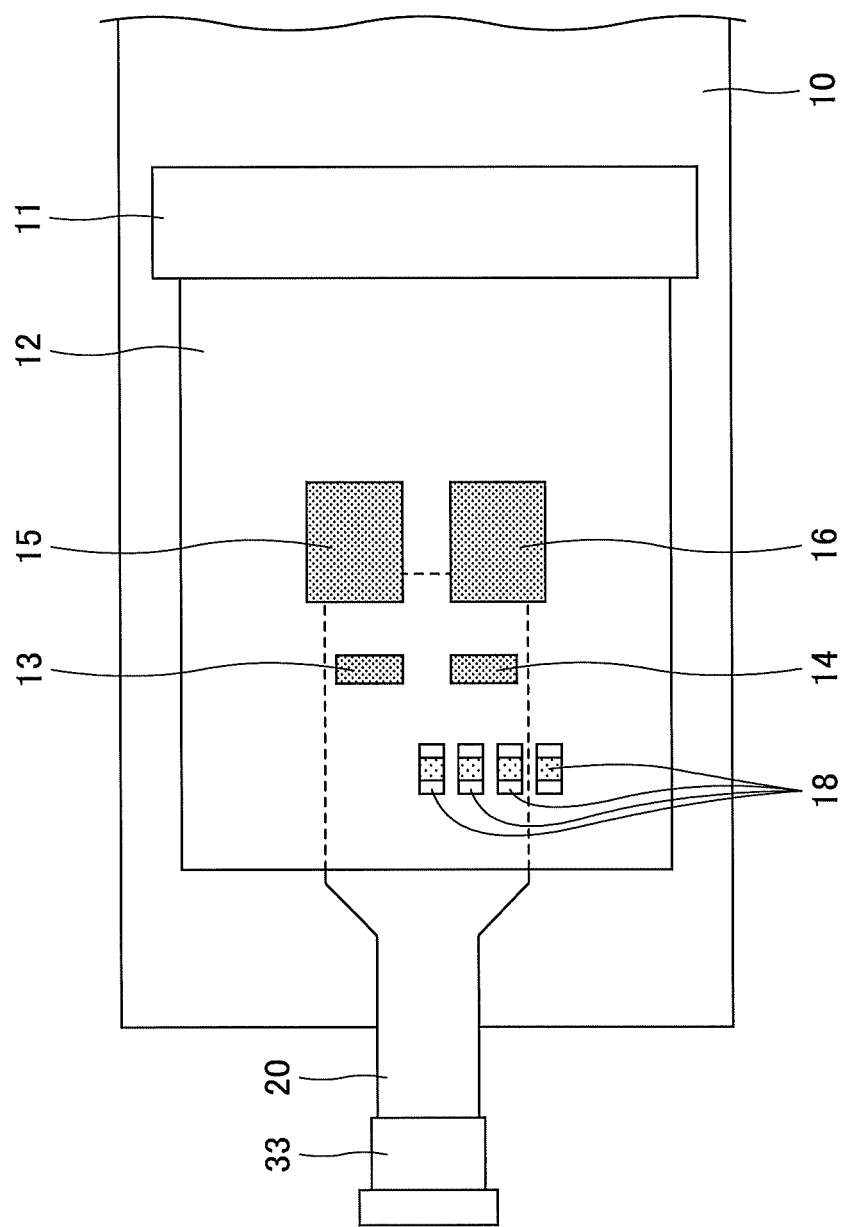
FIG. 2 is a top view of a part of the optical module of the first embodiment.

As illustrated in FIG. 2, the FPC board 12 includes a light-emitting element 13 such as a VCSEL for converting an electric signal into an optical signal, and a light-receiving element 14 such as a photodiode for converting an optical signal into an electric signal. The FPC board 12 also includes a driving integrated circuit (IC) 15 for driving the light-emitting element 13, and a trans-impedance amplifier (TIA) 16 for converting an electric current output from the light-receiving element 14 into a voltage. The limit-emitting element 13 and the light-receiving element 14 are mounted on the FPC board 12 in a "face-down" direction such that the light-emitting surface of the light-emitting element 13 and the light-receiving surface of the light-receiving element 14 face the FPC board 12. The light-emitting element 13 and the light-receiving element 14 are mounted on a first surface of the FPC board 12, and the optical waveguide 20 is mounted on a second surface of the FPC board 12. The light-emitting element 13, the light-receiving element 14, the driving IC 15, and the TIA 16 are mounted on the FPC board 12 by flip-chip bonding.

Capacitors 18, for example, are provided near the light-receiving element 14. Electrical filters which consist of capacitors, and resisters or inductors can be used for this purpose. The capacitors 18 are provided to stabilize the bias voltage for the cathodes of photodiodes 14a of the light-receiving element 14 and thereby stabilize detection signals of the photodiodes 14a. A terminal of each capacitor 18 is connected to the cathode of the corresponding photodiode 14a, and another terminal of the capacitor 18 is connected to the signal ground of the FPC board 12 and is thereby grounded. In the example of FIG. 2, four capacitors 18 are provided to support four channels.

As illustrated in FIG. 3, the light-receiving element 14 includes four photodiodes 14a. The cathode of each photodiode 14a is connected to a terminal of the corresponding capacitor 18, and another terminal of the capacitor 18 is connected to the signal ground and is thereby grounded. The photodiodes 14a of the light-receiving element 14 are connected to corresponding TIA circuits 16a of the TIA 16. The capacitors 18 are preferably disposed close to the light-receiving element 14 to effectively stabilize detection signals. More specifically, as the connection distance between the capacitors 18 and the light-receiving element 14 decreases, the signal transfer characteristic can be improved in a wider frequency band. For this reason, the capacitors 18 are disposed near the light-receiving element 14 on the first surface of the FPC board 12 on which the light-receiving element 14 is provided.

Each capacitor 18 has a capacitance of several tens of µF. Generally, the capacitor 18 may have dimensions of 1 mm×0.5 mm×0.5 mm or 0.6 mm×0.3 mm×0.3 mm. In the example of the present embodiment, the capacitor 18 has dimensions of 0.6 mm×0.3 mm×0.3 mm.

The optical waveguide 20 is formed like a flexible sheet, and includes multiple cores surrounded by clads. Light entering the optical waveguide 20 propagates through the cores.

The optical connector 30 includes a lens ferrule 31 and a mechanically transferable (MT) ferrule 32 that are connected to each other. The optical waveguide 20 is connected to the lens ferrule 31, and the junction between the optical waveguide 20 and the lens ferrule 31 is protected by a ferrule boot 33. The clip 40 is fixed to the lower housing 51 with screws 53 that are passed through screw holes formed in the clip 40 and screwed into screw holes 51a formed in the lower housing 51.

Sleeves 61a and 61b are fixed by a crimp ring 62 to the optical cable 60. A portion of the optical cable 60 to which the sleeves 61a and 61b are fixed is covered by upper and lower cable boots 71 and 72, and a pull-tab/latch part 73 is attached to the cable boots 71 and 72.

The upper housing 52 is placed on the lower housing 51 to which the optical connector 30 is fixed by the clip 40 and on which the connector board 10 connected with the FPC board 12 is placed. Screws 54 are screwed into screw holes 52a of the upper housing 52 and screw holes 51b of the lower housing 51 to fix the upper housing 52 to the lower housing 51. The lower housing 51 and the upper housing 52 are formed of a metal with high thermal conductivity such as aluminum (Al).

In the optical module of the first embodiment, as illustrated in FIG. 4, a recess 55 is formed in an area of the inner surface of the upper housing 52 to face the capacitors 18. The recess 55 is formed in an area of the inner surface of the upper housing 52 to face the capacitors 18 in order to increase the gap between the upper housing 52 and the capacitors 18 and thereby prevent discharge of static electricity. This configuration can prevent static electricity from flowing from the upper housing 52 to the capacitors 18.

Figure 5:
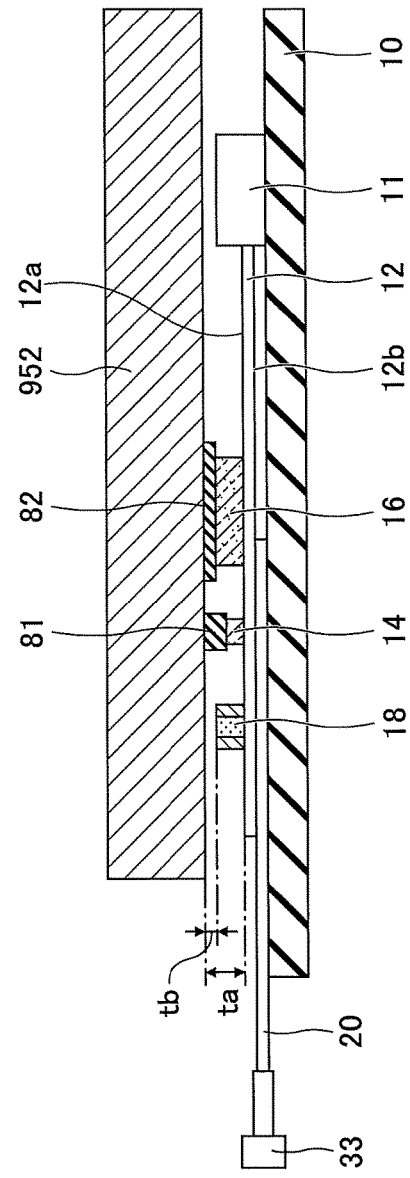
FIG. 5 is a cross-sectional view of an optical module of a comparative example.

The above effect of the first embodiment is described in more detail by using a comparative example in FIG. 5. FIG. 5 is a cross-sectional view of an optical module of a comparative example where no recess is formed in the inner surface of an upper housing 952. The upper housing 952 has substantially the same configuration as the upper housing 52 except that no recess is formed in its inner surface. The heights of the light-receiving element 14 and the TIA 16 are between 150 µm and 250 µm. A radiating sheet 81 is disposed between the light-receiving element 14 and the upper housing 952, and a radiating sheet 82 is disposed between the TIA 16 and the upper housing 952. The radiating sheets 81 and 82 have high thermal conductivity, and transmit heat generated in the light-receiving element 14 and the TIA 16 to the upper housing 952. Also, the radiating sheets 81 and 82 have elasticity and have a thickness of about 500 µm in their original state. When the radiating sheets 81 and 82 are sandwiched between the upper housing 952 and the light-receiving element 14 and the TIA 16 and a force is applied to the radiating sheets 81 and 82, the radiating sheets 81 and 82 are deformed and their thickness is reduced to about 100 µm to 200 µm.

Assuming that the height of the light-receiving element 14 is 200 µm and the thickness of the deformed radiating sheet 81 is 200 µm, a gap ta between the FPC board 12 and the upper housing 952 becomes 400 µm. Also, assuming that the height of the capacitors 18 connected to the light-receiving element 14 is 0.3 mm (300 µm), a gap tb between the capacitors 18 and the upper housing 952 becomes 100 µm, which is much narrower than the gap ta between the FPC board 12 and the upper housing 952. For this reason, when static electricity flows into the upper housing 952, the static electricity is readily discharged and transmitted from the upper housing 952 to the electrodes of the capacitors 18, flows into the signal ground, and may cause the optical module to fail.

In the first embodiment, as illustrated in FIG. 4, the recess 55 is formed in an area of the inner surface of the upper housing 52 to face the capacitors 18. Also in the optical module of the first embodiment, the light-receiving element 14 and the TIA 16 are mounted on a surface 12a of the FPC board 12, and the radiating sheets 81 and 82 are disposed between the upper housing 52 and the light-receiving element 14 and the TIA 16. The optical waveguide 20 is attached to a surface 12b of the FPC board 12.

The radiating sheets 81 and 82 are radiators and formed of a material that has insulating properties and relatively-high thermal conductivity. For example, the radiating sheets 81 and 82 may be formed of silicon rubber, silicon grease, or an epoxy resin including an alumina filler. The radiating sheets 81 and 82 having high thermal conductivity can smoothly transmit heat generated in the light-receiving element 14 and the TIA 16 to the upper housing 52. With this configuration, the optical module can radiate heat from the upper housing 52. Also, the radiating sheets 81 and 82 have elasticity and have a thickness of about 500 μm in their original state. When the radiating sheets 81 and 82 are sandwiched between the upper housing 52 and the light-receiving element 14 and the TIA 16 and a force is applied to the radiating sheets 81 and 82, the radiating sheets 81 and 82 are deformed and their thickness is reduced to about 100 μm to 200 μm.

Assuming that the height of the light-receiving element 14 is 200 μm and the thickness of the deformed radiating sheet 81 is 200 μm, a gap tc between the FPC board 12 and the upper housing 52 becomes 400 μm. Also, assuming that the height of the capacitors 18 connected to the light-receiving element 14 is 0.3 mm (300 μm), a depth ds of the recess 55 is set such that a gap ts between a bottom 55a of the recess 55 and the capacitors 18 becomes greater than the gap tc between the FPC board 12 and the inner surface of the upper housing 52 excluding the area where the recess 55 is formed. That is, the recess 55 is formed such that the gap ts becomes greater than 400 μm, and the depth ds of the recess 55 is greater than 300 μm. With the recess 55 having the depth ds and formed in the inner surface of the upper housing 52, even when static electricity flows into the upper housing 52, discharge of the static electricity from the upper housing 52 to the electrodes of the capacitors 18 can be prevented.

The gap tc between the FPC board 12 and the upper housing 52 is set such that even when static electricity flows into the upper housing 52, the static electricity is not discharged from the upper housing 52 to electrodes formed on the FPC board 12. Accordingly, with the recess 55 having the depth ds and formed in the inner surface of the upper housing 52 such that the gap is between the bottom 55a of the recess 55 and the capacitors 18 becomes greater than the gap tc between the FPC 12 and the upper housing 52, even when static electricity flows into the upper housing 52, it is possible to prevent the static electricity from being discharged from the upper housing 52 to the capacitors 18.

Figure 6:
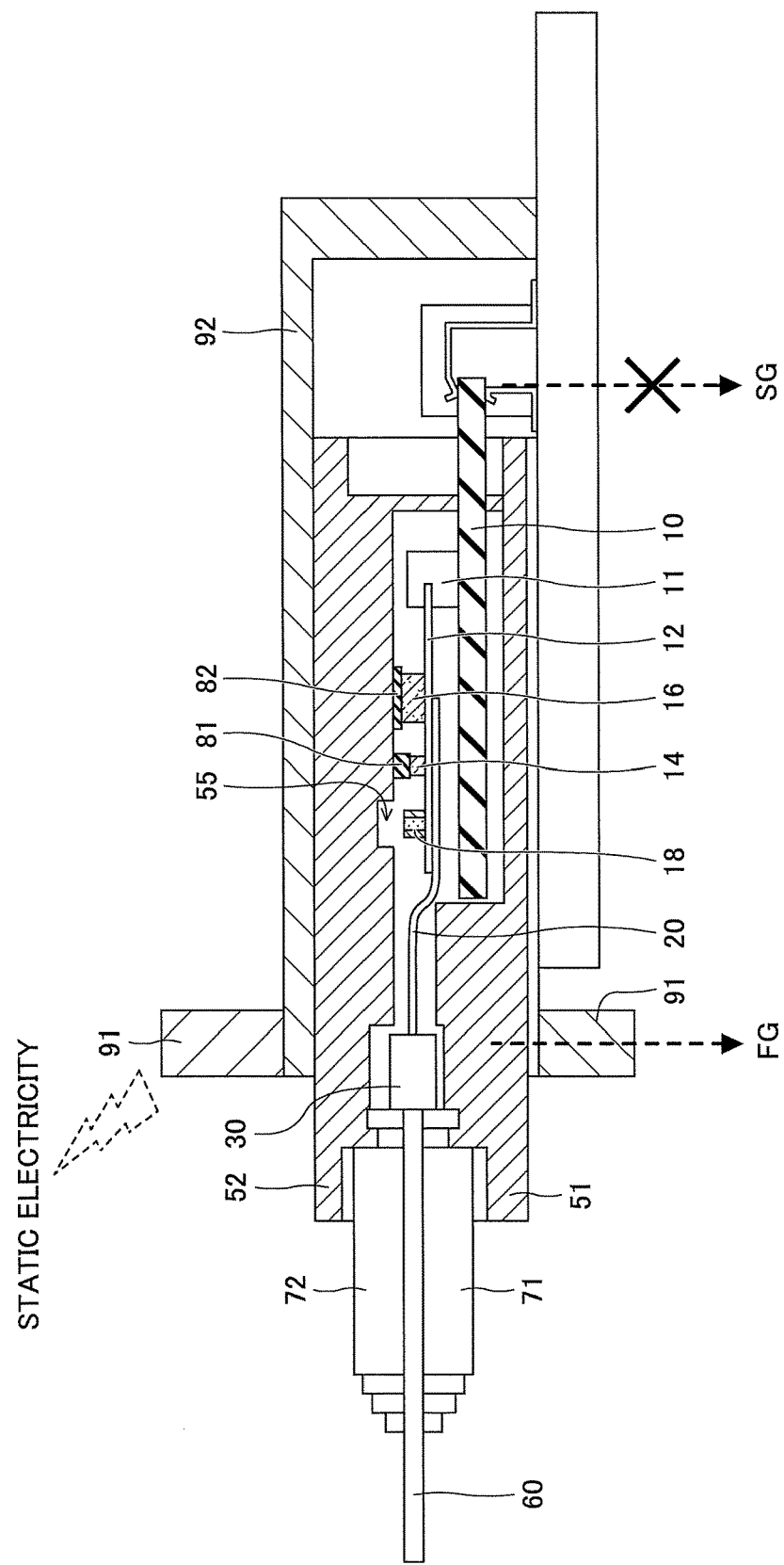
FIG. 6 is a drawing illustrating a case where static electricity flows into the optical module of the first embodiment.

According to the first embodiment, as illustrated in FIG. 6, static electricity flown into a frame 91 flows through a case 92 and the upper housing 52 and the lower housing 51 of the optical module, flows again into the frame 91, and then flows into a frame ground (FG). Thus, the static electricity is not discharged from the upper housing 52 to the electrodes of the capacitors 18, and therefore does not flow into a signal ground (SG) of the FPC board 12. This configuration can improve the reliability of the optical module.

In the optical module with the configuration of FIG. 5, it is possible to prevent static electricity from being discharged from the upper housing 952 to the capacitors 18 by increasing the distance between the upper housing 952 and the capacitors 18. However, this approach increases the size of the optical module and cannot satisfy the demand for downsizing of the optical module.

In the present embodiment, when L in FIG. 4 indicates a length from one terminal to the other terminal of the capacitor 18 in the lateral direction, a width W of the recess 55 in the lateral direction is preferably greater than or equal to L+2tc so that the distance between each terminal of the capacitor 18 and the corresponding side wall of the recess 55 in the lateral direction becomes greater than or equal to the gap tc between the FPC board 12 and the upper housing 52.

For example, when the gap tc is 0.4 mm (400 μm) and the length L is 0.6 mm (600 μm), the width W of the recess 55 is preferably greater than or equal to 600 μm+2×400 μm=1400 μm (1.4 mm). This configuration can prevent the discharge of static electricity from the upper housing 52 to the capacitor 18 even in the length direction of the capacitor 18.

Second Embodiment

Figure 7:
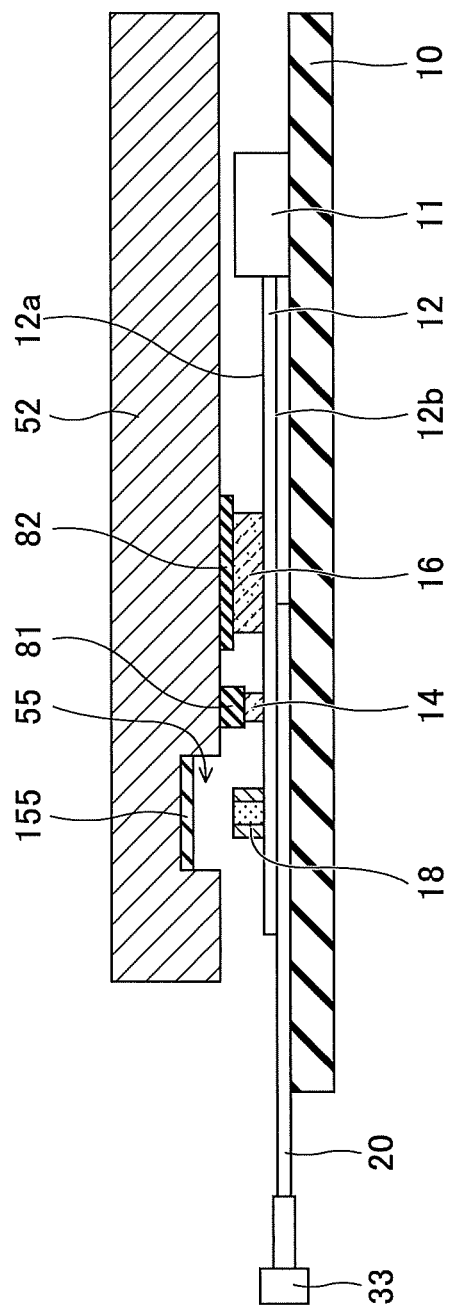
FIG. 7 is a cross-sectional view of a part of an optical module of a second embodiment.

Next, an optical module according to a second embodiment is described. In the optical module of the second embodiment, as illustrated in FIG. 7, an insulator 155 is embedded in the recess 55 formed in the inner surface of the upper housing 52. Embedding the insulator 155 in the recess 55 makes it possible to prevent discharge in the air between the upper housing 52 and the electrodes of the capacitors 18, and thereby makes it possible to improve the reliability of the optical module.

Examples of materials for the insulator 155 include oxides such as silicon oxide and aluminum oxide having insulating properties, and resins such as polyimide having insulating properties. To prevent formation of large capacitance between the upper housing 52 and the capacitors 18, the insulator 155 is preferably formed of a material with a low relative dielectric constant. A resin can be easily embedded in the recess 55. Therefore, a resin is preferably used as the material of the insulator 155 to reduce the costs for manufacturing the optical module.

Other components and configurations of the optical module of the second embodiment are substantially the same as those described in the first embodiment.

An aspect of this disclosure provides an optical module, and makes it possible to prevent static electricity from flowing into a signal ground even when a capacitor connected to a light-emitting element is provided in a housing of the optical module and thereby improve the reliability of the optical module.

Optical modules according to embodiments of the present invention are described above. However, the present invention is not limited to the specifically disclosed embodiments, and variations and modifications may be made without departing from the scope of the present invention.

What is claimed is:

1. An optical module, comprising:
   a board including a first surface and a second surface;
   a light-receiving element mounted on the first surface of the board;
   at least one capacitor mounted on the first surface of the board and connected to the light-receiving element, the capacitor including a lower surface that is in contact with the first surface of the board and an upper surface that is opposite the lower surface;
   an optical waveguide attached to the second surface of the board and configured to transmit light; and
   a housing that covers the board, wherein
   a recess is formed in an area of an inner surface of the housing to face the capacitor; and
   a gap between a bottom of the recess and the upper surface of the capacitor is greater than a gap between the first surface of the board and the inner surface of the housing excluding the area where the recess is formed.

2. The optical module as claimed in claim 1, wherein the light-receiving element is a photodiode;
   a first terminal of the capacitor is connected to a cathode of the photodiode; and
   a second terminal of the capacitor is grounded.

3. An optical module, comprising:

a board including a first surface and a second surface;

a light-receiving element mounted on the first surface of the board;

a capacitor mounted on the first surface of the board and connected to the light-receiving element, the capacitor including a lower surface that is in contact with the first surface of the board and an upper surface that is opposite the lower surface;

an optical waveguide attached to the second surface of the board and configured to transmit light;

a housing that covers the board, a recess being formed in an area of an inner surface of the housing to face the capacitor; and an insulator disposed between the upper surface of the capacitor and a bottom of the recess, wherein a gap between a bottom of the recess and the upper surface of the capacitor is greater than a gap between the first surface of the board and the inner surface of the housing excluding the area where the recess is formed.

4. An optical module, comprising:

a board including a first surface and a second surface;

a light-receiving element mounted on the first surface of the board;

a capacitor mounted on the first surface of the board and connected to the light-receiving element;

an optical waveguide attached to the second surface of the board and configured to transmit light;

a housing that covers the board, a recess being formed in an area of an inner surface of the housing to face the capacitor; and a radiator that is disposed between and in contact with the light-receiving element and the inner surface of the housing, wherein the inner surface includes the area where the recess is formed and also includes an area that faces the light-receiving element.

5. The optical module as claimed in claim 1, wherein the gap between the bottom of the recess and the upper surface of the capacitor is greater than the gap between the first surface of the board and the inner surface of the housing at a position where the light-receiving element is mounted.

* * * * *